United States Patent
Chen et al.

(10) Patent No.: US 12,198,931 B2
(45) Date of Patent: Jan. 14, 2025

(54) ION IMPLANTATION METHOD FOR REDUCING ROUGHNESS OF PATTERNED RESIST LINES

(71) Applicant: Taiwan Semiconductor Manufacturing Company, Ltd., Hsinchu (TW)

(72) Inventors: Chun-Liang Chen, Hsinchu (TW); Wei-Ting Chien, Hsinchu (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 271 days.

(21) Appl. No.: 17/659,283

(22) Filed: Apr. 14, 2022

(65) Prior Publication Data
US 2023/0335401 A1    Oct. 19, 2023

(51) Int. Cl.
*H01L 21/027* (2006.01)
*G03F 7/40* (2006.01)
(Continued)

(52) U.S. Cl.
CPC ............ *H01L 21/0274* (2013.01); *G03F 7/40* (2013.01); *H01L 21/0273* (2013.01);
(Continued)

(58) Field of Classification Search
None
See application file for complete search history.

(56) References Cited

U.S. PATENT DOCUMENTS 6,838,347 B1   1/2005   Liu et al.
8,133,804 B1 *  3/2012  Godet ................ H01J 37/3056
                                                    438/528
(Continued)

FOREIGN PATENT DOCUMENTS

WO    WO2017112354    *  6/2017   ........... H01L 21/027

OTHER PUBLICATIONS

H. Xiao, "Introduction to Semiconductor Manufacturing Technology", SPIE Press, ISBN 978-0-8194-9092-6, Chapter 9. (Year: 2012).*

(Continued)

*Primary Examiner* — Jiong-Ping Lu
(74) *Attorney, Agent, or Firm* — Lorenz & Kopf, LLP

(57) ABSTRACT

A method is disclosed that includes performing a directional ion implantation process on a developed resist pattern to reduce roughness. A substrate can be tilted at a tilt angle with respect to the direction of an incoming ion beam. Ions can be directionally implanted at the tilt angle, along sidewall surfaces of the developed resist pattern to trim roughness from the sidewall surfaces. After implanting, the substrate can be rotated along the axis normal to a surface, and ions can then be directionally implanted at the tilt angle along the sidewall surfaces to further trim roughness from the sidewall surfaces of the developed resist pattern. The directional ion implantation process can be performed over a number of iterations, and during each iteration of the directional ion implantation process, the tilt angle can be adjusted so that the tilt angle is different than during previous iterations.

20 Claims, 13 Drawing Sheets

(51) Int. Cl.
*H01L 21/033* (2006.01)
*H01L 21/308* (2006.01)
*H01L 21/311* (2006.01)
*H01L 21/3115* (2006.01)

(52) U.S. Cl.
CPC ...... *H01L 21/0337* (2013.01); *H01L 21/3086* (2013.01); *H01L 21/31138* (2013.01); *H01L 21/31144* (2013.01); *H01L 21/31155* (2013.01)

(56) References Cited

U.S. PATENT DOCUMENTS

| | | |
|---|---|---|
| 9,146,469 B2 | 9/2015 | Liu et al. |
| 9,159,561 B2 | 10/2015 | Chen et al. |
| 9,557,649 B2 | 1/2017 | Huang et al. |
| 9,659,784 B1 | 5/2017 | Petterson et al. |
| 10,049,918 B2 | 8/2018 | Hung et al. |
| 10,520,821 B2 | 12/2019 | Liu et al. |
| 10,768,527 B2 | 9/2020 | Su et al. |
| 11,127,592 B2 | 9/2021 | Chang et al. |
| 2011/0117749 A1 | 5/2011 | Sheu et al. |
| 2015/0155171 A1 | 6/2015 | Chang et al. |
| 2018/0204719 A1* | 7/2018 | Ma ..................... H01L 21/0273 |
| 2020/0133133 A1 | 4/2020 | Park et al. |

OTHER PUBLICATIONS

Line Edge Roughness, part 1. The Lithography Expert (Feb. 2007). Tutor56c.doc: Version Nov. 28, 2006.

Azamouche, L.M. et al. "Plasma treatments to improve line-width roughness during gate patterning", J. of Micro/Nanolithography, MEMS, and MOEMS, Aug. 2013, pp. 041304-2 to 041304-8, vol. 12. No 4.

* cited by examiner

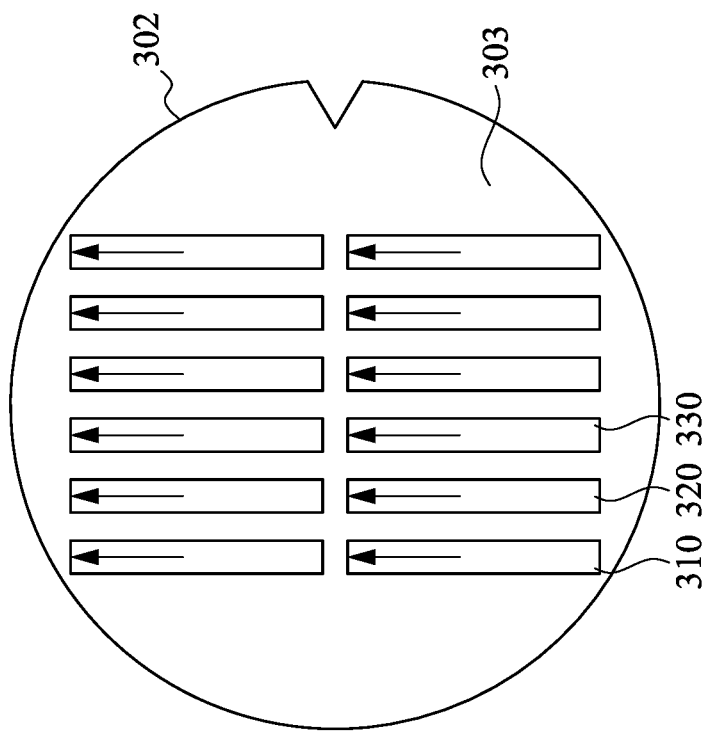
Fig. 3G
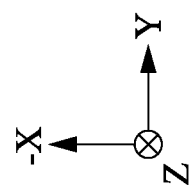

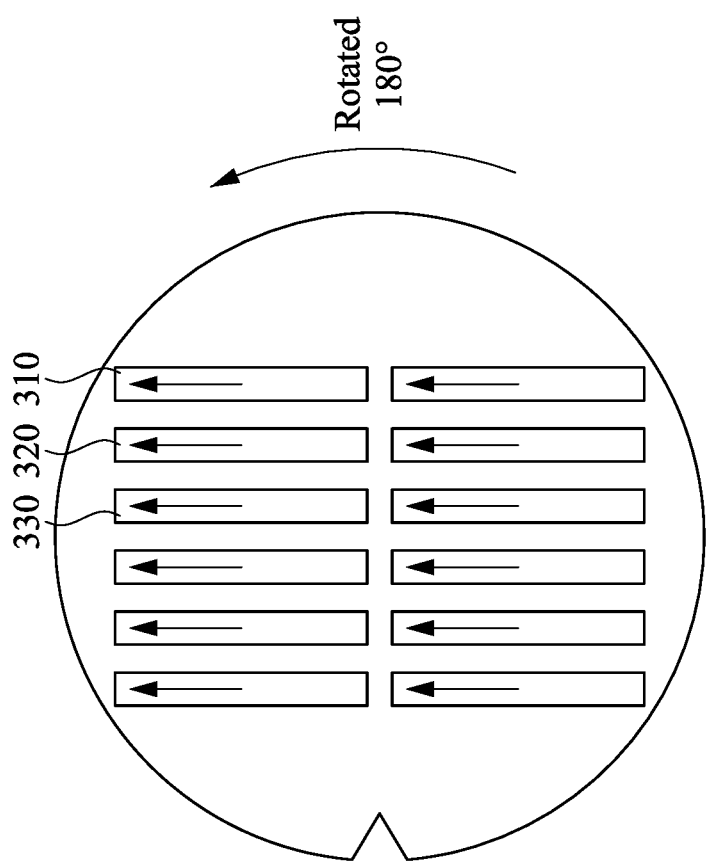
Fig. 3K
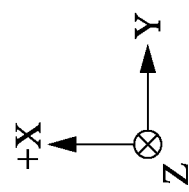

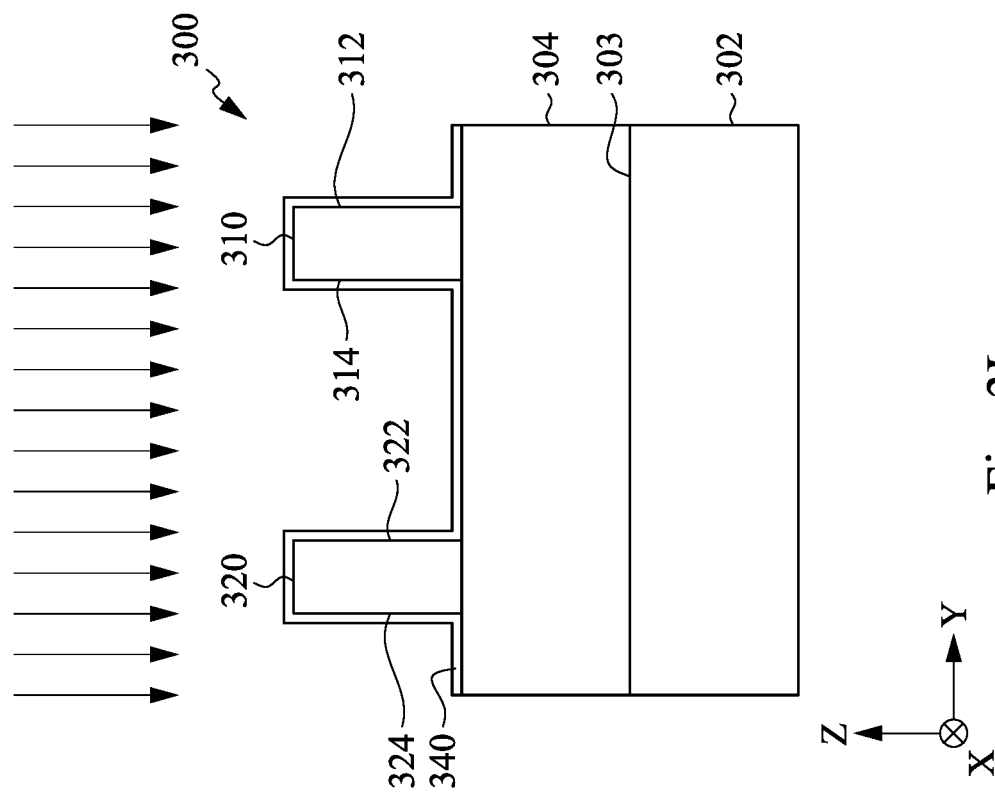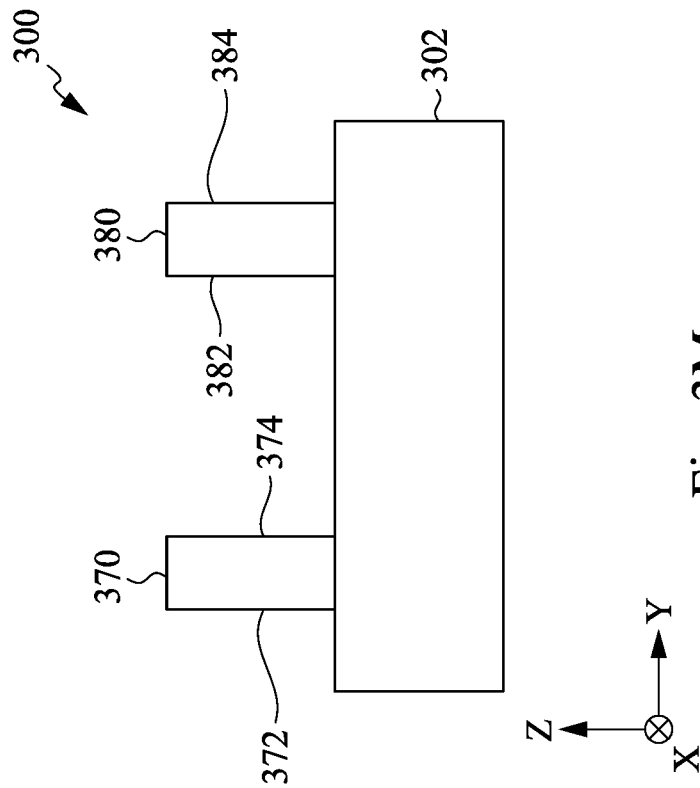
Fig. 3L
Fig. 3M

ION IMPLANTATION METHOD FOR REDUCING ROUGHNESS OF PATTERNED RESIST LINES

BACKGROUND

Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

As feature sizes continue to decrease, it is a challenge to form reliable semiconductor devices at smaller and smaller sizes. Fabrication processes continue to become more complex, especially with decreasing lithographic feature sizes, decreasing critical dimensions of features and decreasing pitch between features.

High resolution lithography processes have become more and more challenging. Extreme ultraviolet (EUV) radiation sources have been utilized to provide short exposure wavelengths so as to further reduce minimum printable size on a substrate. In order to transfer precise and accurate features to underlying layers, it is desirable that features of the resist layer have minimum line roughness. However, at such small dimensions, the roughness of patterned resist lines has become harder and harder to control. There is a need for technologies that can control and minimize line roughness of patterned resist lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D, 3H, 3I, 3L and 3M are cross-sectional views of various stages of a process for reducing roughness of a resist pattern used in fabricating a semiconductor device structure in accordance with some embodiments.

FIGS. 3G and 3K are top perspective views which will be used to further describe rotation of the substrate and the resist lines at various stages of the directional ion implantation process in accordance with some embodiments.

DETAILED DESCRIPTION

Figure 1A:
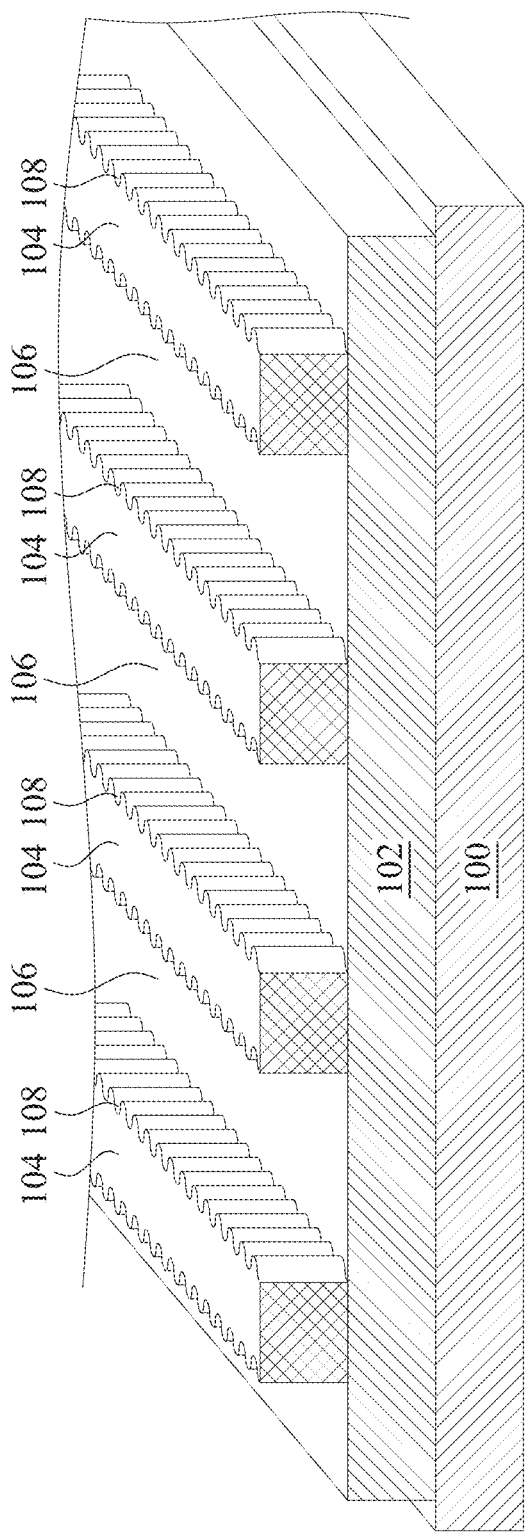
FIG. 1A illustrates an exemplary top sectional view of a substrate having a patterned resist layer that includes a number of lines disposed on an underlying layer of target material to be etched.

The present disclosure relates generally to semiconductor structures, and more particularly, to interconnect structures and methods of forming interconnect structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Further, spatially relative terms, such as "beneath," "below," "under," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Some embodiments of the disclosure will now be described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Additional operations can be provided before, during, and/or after the stages described in these embodiments.

Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As used herein, a "layer" is a region, such as an area comprising arbitrary boundaries, and does not necessarily comprise a uniform thickness. For example, a layer can be a region comprising at least some variation in thickness.

FIG. 1A illustrates an exemplary top sectional view of a substrate 100 having a patterned resist layer that includes a number of lines 104 disposed on an underlying layer 102 of a target material to be etched. Openings 106 between various lines 104 of the patterned resist layer define the spacing between the lines 104. The openings 106 expose the underlying layer 102 of target material to be etched to transfer features into the target material.

EUV lithography requires a desired pattern resolution or minimum pattern dimension patternable by the EUV lithography operation. At semiconductor technology nodes of 7 nm or smaller, for example, line-and-space (L/S) patterning requires pitch resolution smaller than about 32 nm. However, when the sensitivity of the resist is increased, the quality of the developed resist may degrade. For example, a line pattern that results from EUV lithography exposure process may result in lines that have rough sidewall surfaces (e.g., a surface roughness along the sidewall surfaces of the lines 104 that is characterized by protrusions and indentations).

Figure 1B:
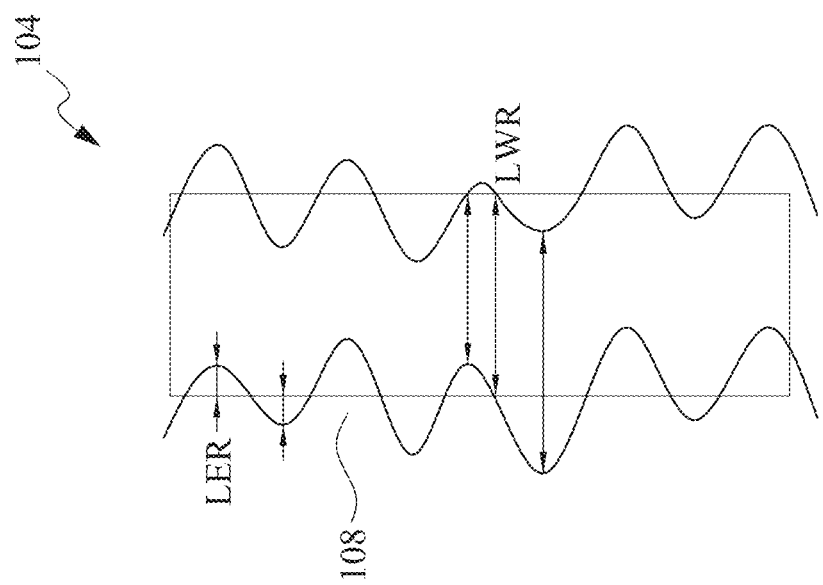
FIG. 1B is a top view of one of the lines illustrated in FIG. 1A with arrows that described line edge roughness (LER) of the line and line width roughness (LWR) of the line.

The roughness of a line can be measured using deviations from a smooth ideal shape. FIG. 1B is a top view of one of the lines 104 illustrated in FIG. 1A. Two measures that can be used to characterize these deviations are commonly referred to as line edge roughness (LER) and line width roughness (LWR) of the line 104, which is shown in FIG. 1B as indentations or protrusions along the surfaces 108 of the lines 104. The term roughness usually denotes the deviation from a reference flat surface or from a reference straight line. The deviation from a reference flat surface of a thin film on a substrate is termed surface roughness. By contrast, the deviation of the edges in a patterned structure from the mean straight line is referred to as LER, whereas the deviation from the mean line width is referred to as LWR. LER/LWR are usually quantified as a function of the frequency and amplitude of the LER/LWR features. The critical dimension (CD) of a feature can be used to provide a relative reference scale for the frequency of the LER/LWR features.

The line roughness of the lines 104 of the patterned resist layer may result in inaccurate feature transfer to the underlying layer 102, which can in turn lead to geometric variations in features that are eventually patterned using the patterned resist layer as the starting point of the patterning process. This can lead to varied electrical performance among other problems. These problems with conventional photolithography processes are well documented. It would be desirable to reduce the roughness of the lines that make up a resist pattern.

Figure 2A:
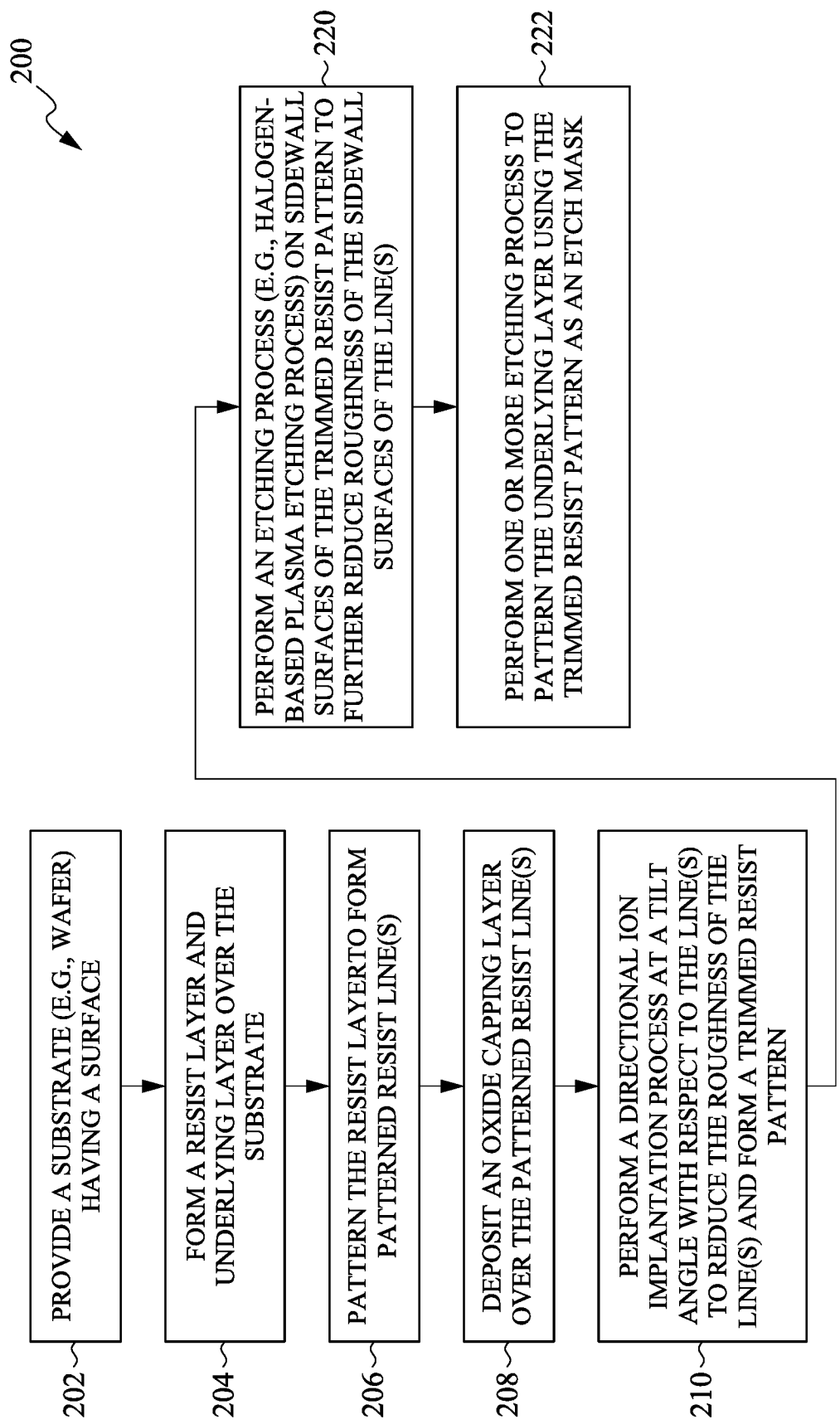
FIGS. 2A and 2B are collectively a flowchart of a method of reducing roughness of a resist pattern in accordance with some embodiments.
Figure 2B:
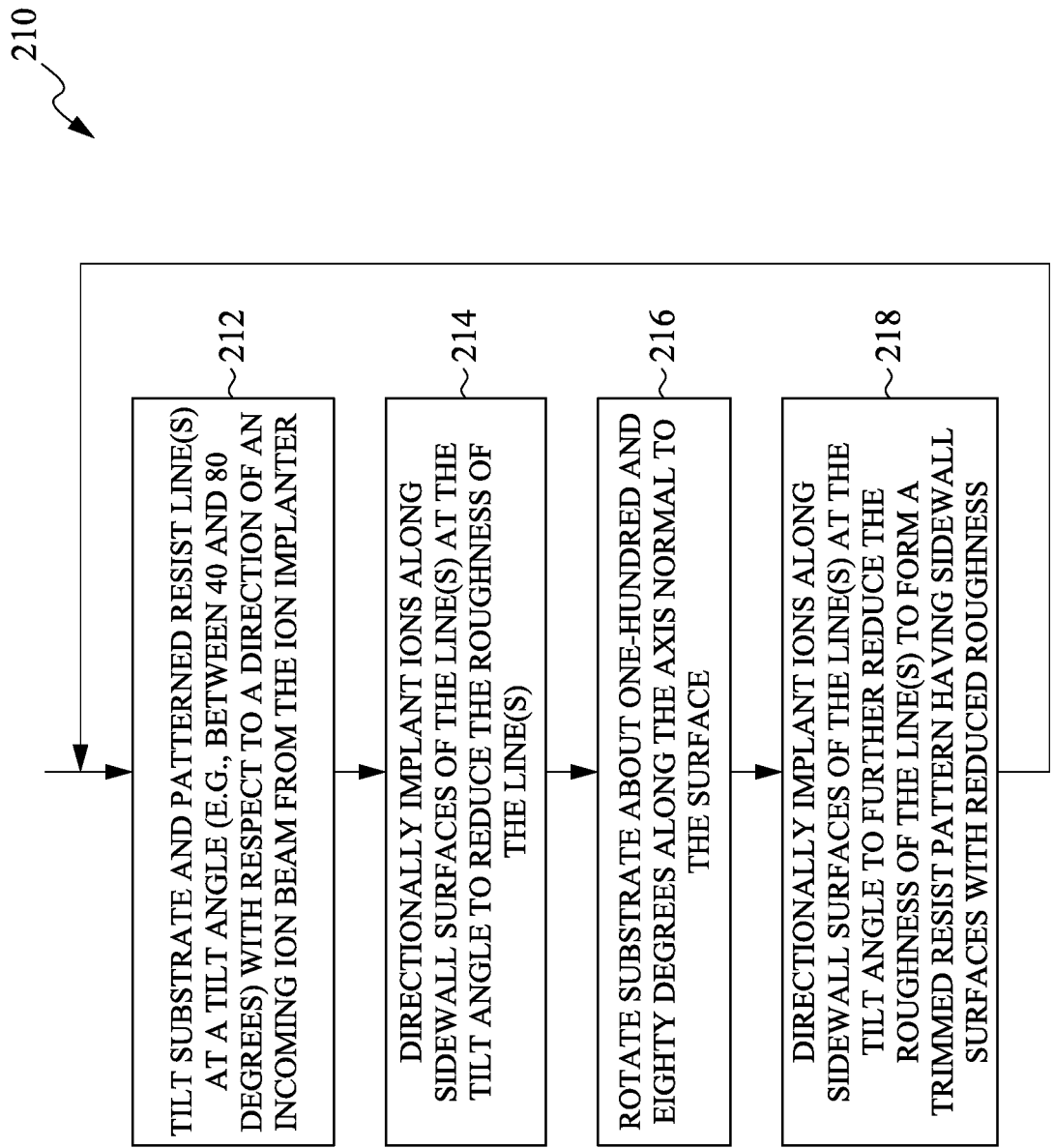

FIGS. 2A and 2B are collectively a flowchart of a method 200 of reducing roughness of a resist pattern in accordance with some embodiments. It is understood that additional steps can be provided before, during, and after the method 200, and some of the steps described can be replaced or eliminated for other embodiments of the method 200.

The method 200 begins at step 202 in which a substrate is provided, and continues with step 204 in which a resist layer can be formed overlying the substrate. It should be appreciated that in some embodiments, prior to the formation of the resist layer, one or more material layers may also be formed over the substrate. Without limitation, some non-limiting examples of material layers that may be formed between the resist layer and the substrate can include, for example, one or more etch layers, hard mask layers, dielectric layers, anti-reflection coating (ARC) layers, etc. In one embodiment, the resist layer may be formed, for example, by a spin coating process followed by a soft baking process. Depending on the implementation, the resist layer can be a positive resist or a negative resist.

The method 200 continues with step 206, where the resist layer can be patterned. For example, the resist layer can be exposed to extreme ultraviolet (EUV) light, or another source of actinic radiation, carrying pattern information, and developed to form a developed resist pattern. The developed resist pattern comprises at least one line having sidewalls, and may include multiple lines that are substantially parallel to each other, with each of the lines having sidewalls that exhibit surface roughness. For example, the line(s) may not have ideal critical dimensions (CDs) and/or may exhibit undesirable surface roughness, such as line edge roughness (LER) and/or line width roughness (LWR). As noted above, this non-ideal CD and undesirable LER/LWR may be transferred to an underlying layer and eventually to the substrate, causing IC fabrication issues such as causing certain features to be out of design specifications. As will be described below, the present disclosure addresses the above problems by performing multiple iterations of a directional ion implantation process to reduce roughness of the patterned resist line(s) prior to using them to pattern the underlying layer. Simulations have shown that this directional ion implantation process can reduce roughness, such as LER and/or LWR, of the patterned resist line.

In some embodiments, the method 200 continues with optional step 208 in which an oxide capping layer may be conformally deposited over the developed resist pattern. For example, the oxide capping layer may be deposited by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method. In some embodiments, the oxide capping layer can have a thickness between 10 and 100 angstroms. The oxide capping layer can be added in some embodiments to cover the developed resist pattern to add additional mechanical strength to the resist pattern and/or to compensate for low height and/or low aspect ratio of the lines that make up the resist pattern. This can be beneficial when the lines that make up the resist pattern are thinner and have smaller critical dimensions since it can help prevent the lines from being eroded during subsequent ion implantation steps that will now be described.

The method 200 continues with step 210 in which a directional ion implantation process is performed on the developed resist pattern. The directional ion implantation process can be implemented using an ion implanter (e.g., a plasma enhanced ion source) to directionally implant ions along sidewall surfaces of the line(s). The directional ion implantation process may include several steps 212-218 as will now be described with reference to FIG. 2B.

The directional ion implantation process starts at step 212, where the substrate, and hence the line(s) that are formed over the substrate, are tilted at a tilt angle with respect to the direction of an incoming ion beam from the ion implanter. The tilt angle refers to the angle between the incoming ion beam and an axis normal to the surface of the substrate. In some embodiments, the tilt angle is between 40 and 80 degrees. To explain further, in one non-limiting example, the surface of the substrate may be defined by a plane along a first axis (e.g., x-axis) and a second axis (e.g., y-axis). The line has a length dimension that extends substantially along a direction of the first axis (e.g., x-axis) and a width dimension that extends substantially along a direction of the second axis (e.g., y-axis). A third axis (e.g., z-axis) is perpendicular (i.e., normal to) the first axis (e.g., x-axis) and the second axis (e.g., y-axis). The tilt angle is the angle between the third z-axis and the incoming ion beam.

After tilting the substrate at the tilt angle at 212, the method 200 continues with step 214. At 214, a beam of ions generated by an ion implanted is directionally implanted along the sidewall surfaces of the line(s) at the tilt angle to trim roughness from the sidewall surfaces of the line and reduce the roughness of the line. This reduction in roughness of the line can be a reduced line edge roughness (LER), a reduced line width roughness (LWR), and/or a reduced critical dimension of the line(s) that make up the resist pattern.

Any known ion implantation process can be implemented at 214. As some non-limiting examples, the ion beam can be generated by an ion implanter with a gas as the ion source. In some non-limiting embodiments, the ion species that is implanted can be ions, such as, carbon, silicon, argon, germanium, xenon. In some non-limiting embodiments, the ion beam has a tilt angle from about 40 degrees to about 80 degrees, and is provided with ion energy from about 0.5 keV to about 3.0 keV and ion dose from about $1.0 \times 10^{13}$ ions/cm$^2$ to about $4 \times 10^{15}$ ions/cm$^2$. The temperature during the implant can be between about −100° C. and about 150° C.

The method 200 continues with step 216 in which the substrate is rotated about 180 degrees along the axis normal to the surface. After rotation at 216, the method 200 continues with step 218 in which a beam of ions is directionally implanted at the tilt angle (via the ion implanter) along the sidewall surfaces of the line(s) to further trim roughness from the sidewall surfaces of the line(s) to form a trimmed resist pattern with line(s) having sidewall surfaces with reduced roughness in comparison to the sidewalls of the developed resist pattern.

As shown by the feedback loop, the directional ion implantation process (at 212-218) the method 200 can be repeated over any number of iterations. The tilt angle is adjusted during each iteration (e.g., so that the tilt angle is different than during previous iterations) to further reduce roughness of the sidewall surfaces of the lines that make up the trimmed resist pattern during each iteration, as will be described below with reference to FIGS. 3D-3J. In addition, in some embodiments, during each iteration of the directional ion implantation process (at 212-218), parameters of the directional implant steps 214, 218 can be varied in addition to varying the tilt angle (e.g., between about 40 degrees to about 80 degrees). For example, during each iteration of the directional ion implantation process the ion species that is implanted, the ion energy and/or ion dose could be varied so that they are different then during previous iterations along with any other implantation parameters or conditions.

After performing the directional ion implantation process (as described with reference to steps 212-218) over any number of iterations, the method 200 may continue with step 220 in which an etching process (e.g., halogen-based plasma etching process) may be performed on the sidewall surfaces of the trimmed resist pattern to further reduce roughness of the sidewall surfaces of the trimmed resist pattern. In some embodiments, the etching process can be a directional etching process, such as horizontal or surface anisotropic or selective etching, in which a trimmed resist pattern is etched substantially in only one direction within a plane parallel to the substrate, substantially without etching another direction.

The method 200 may then continue with step 222 in which the underlying layer may be patterned by performing one or more etching process using the trimmed resist pattern that overlies the underlying layer as an etch mask.

Figure 3B:
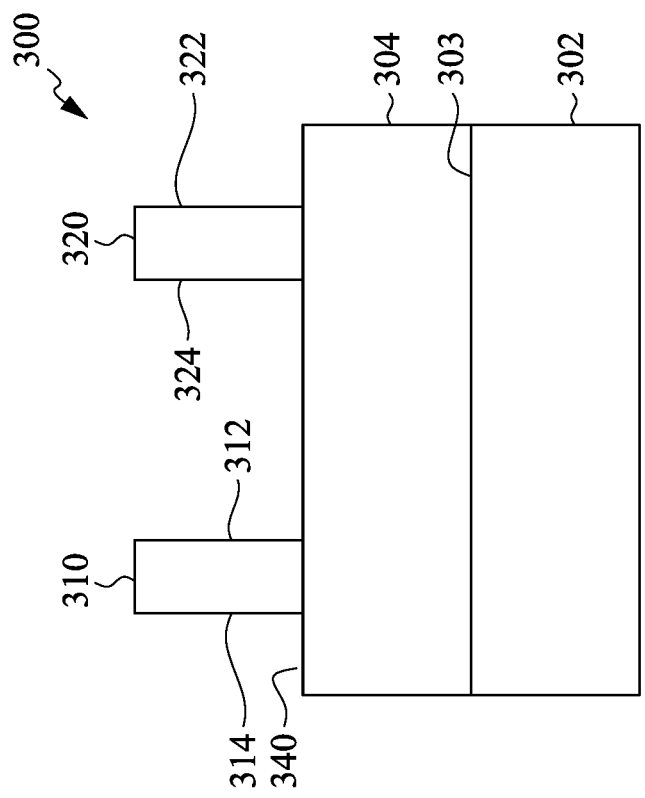
Figure 3B:
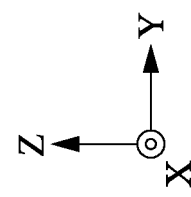
Figure 3A:
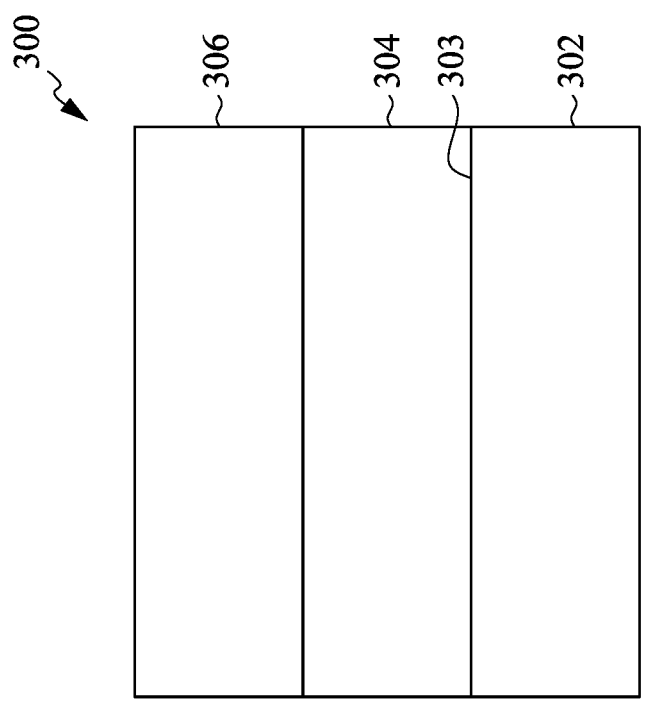
Figure 3A:
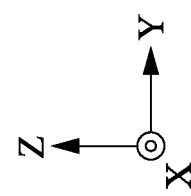
Figure 3C:
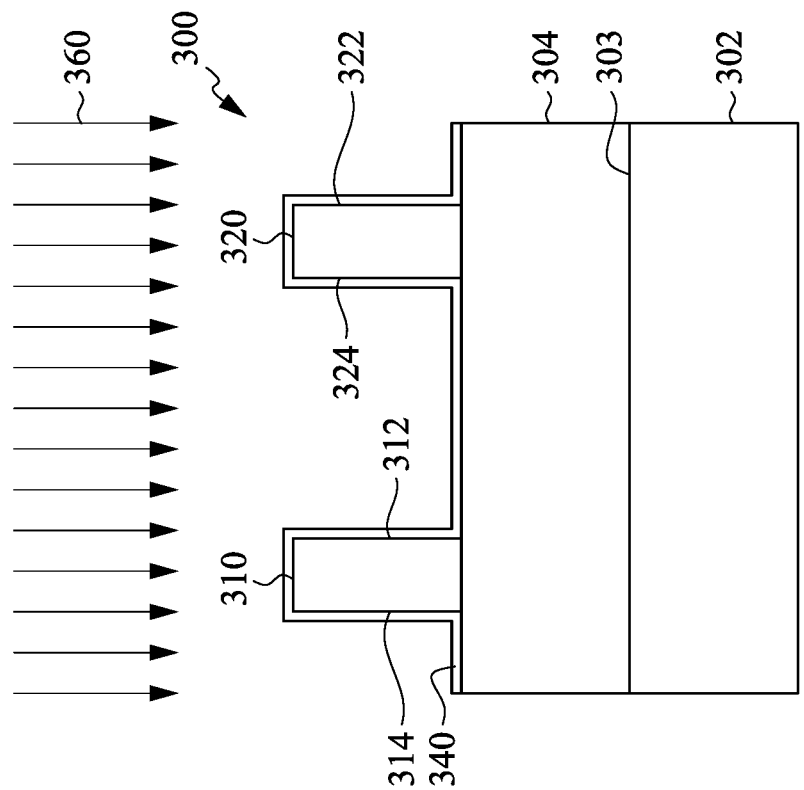
Figure 3D:
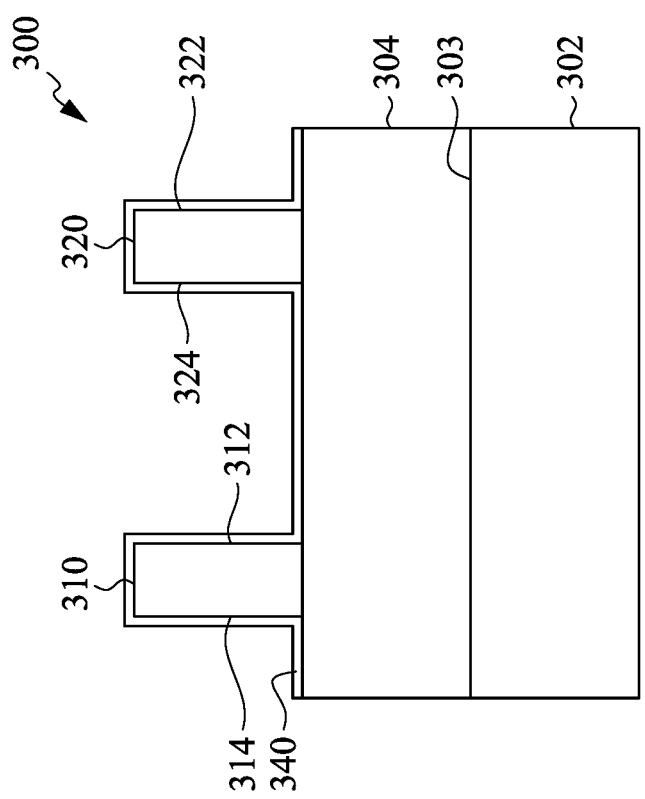
Figure 3E:
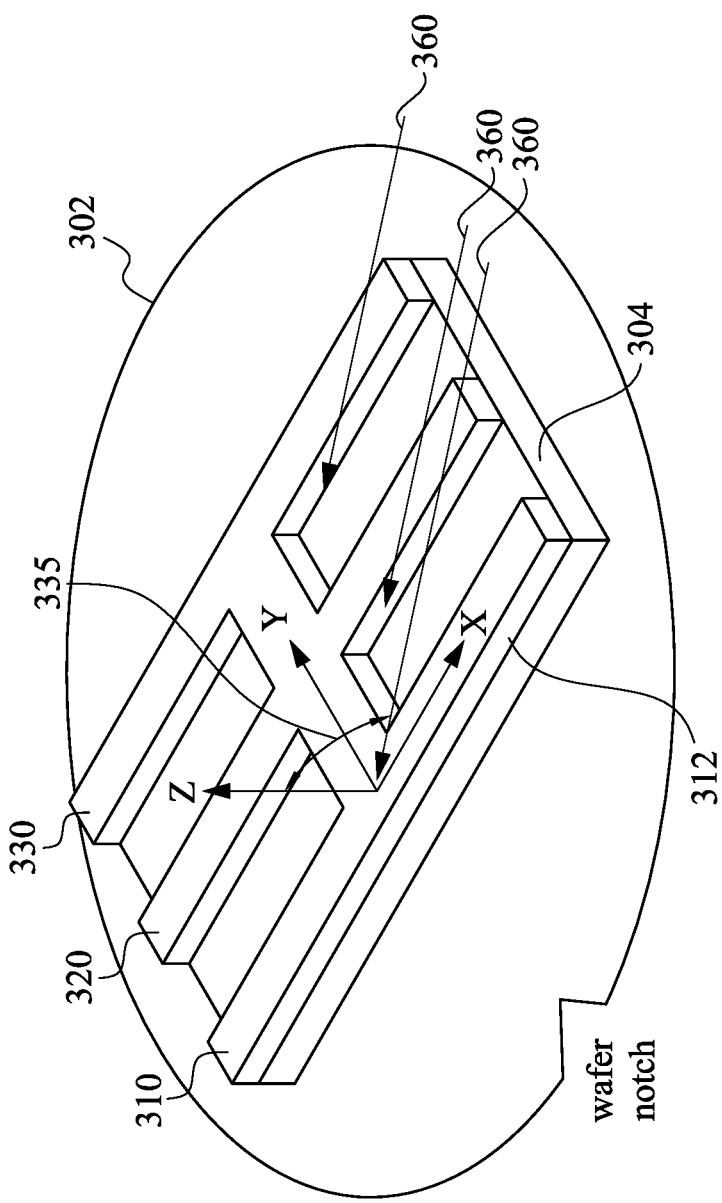
FIGS. 3E and 3J are side perspective views which will be used to further describe a tilt angle of a substrate and the resist lines formed thereon at various stages of the directional ion implantation process in accordance with some embodiments.
Figure 3F:
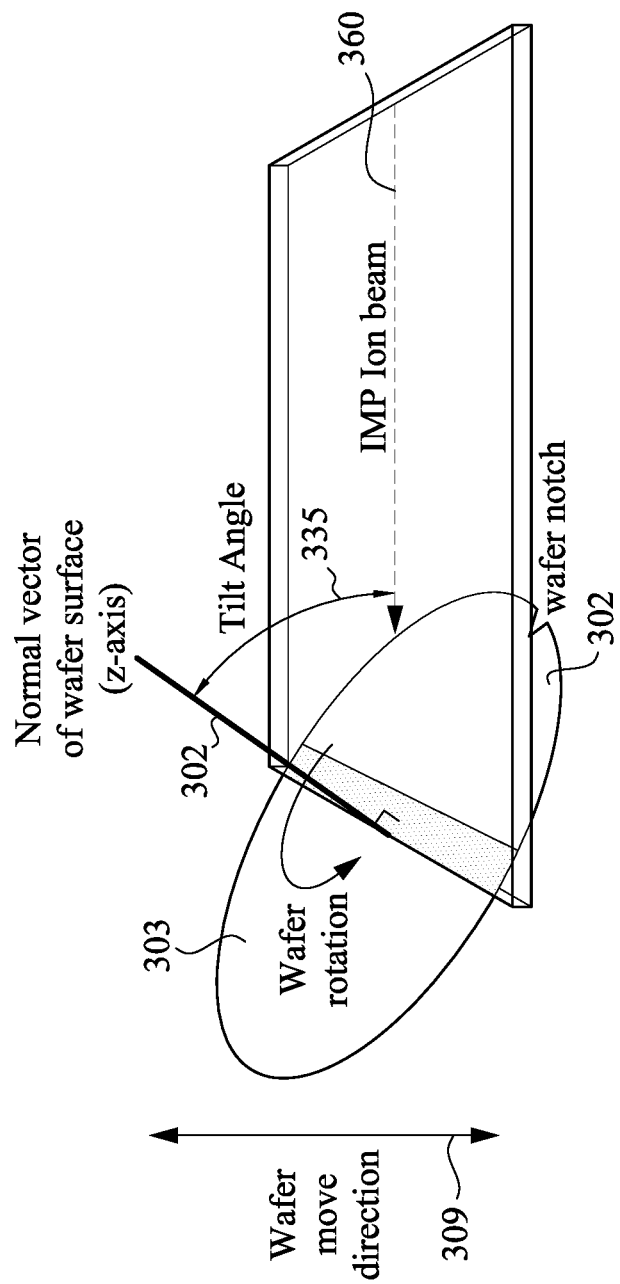
FIG. 3F is a schematic diagram that further illustrates the tilt angle of the substrate with respect to an ion beam and scanning direction that substrate moves in during an ion implantation process.
Figure 3I:
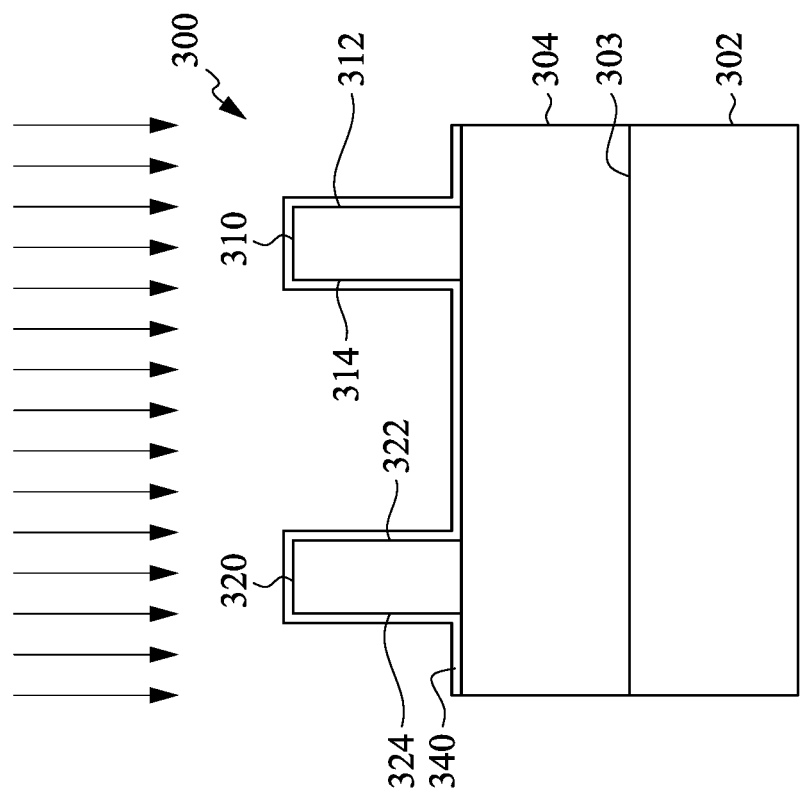
Figure 3H:
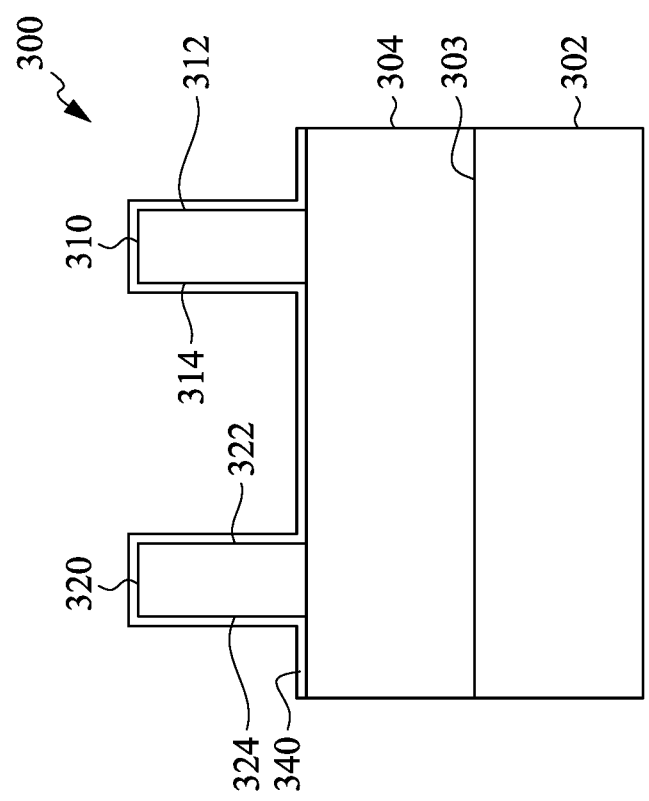
Figure 3J:
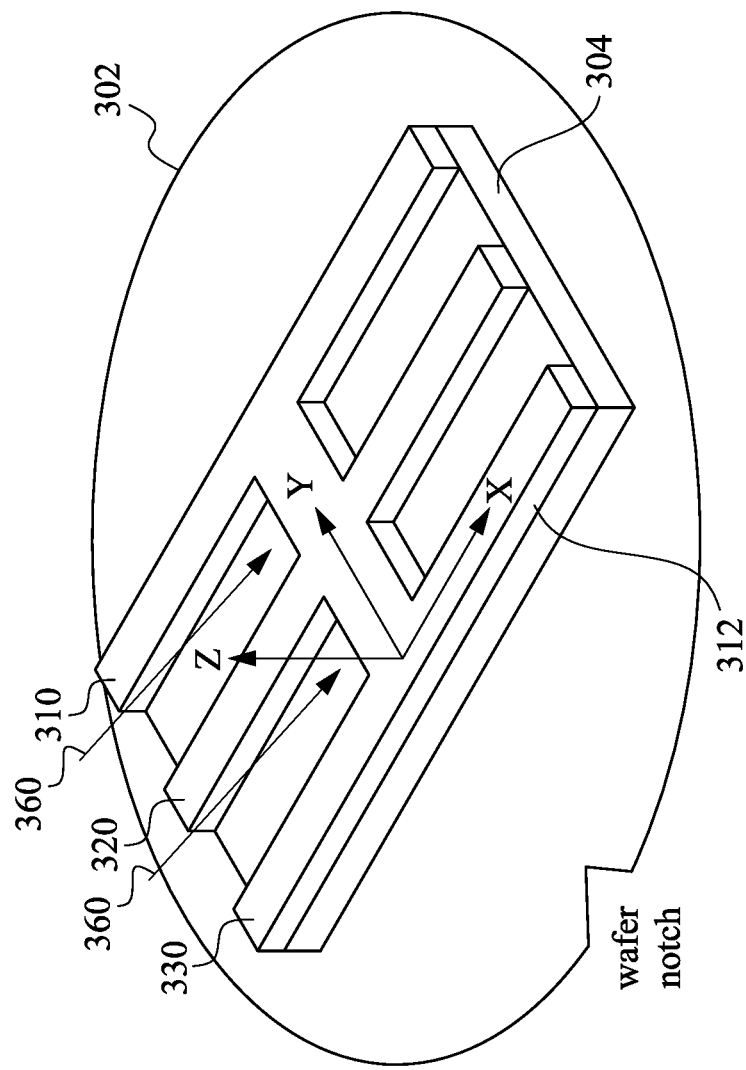

FIGS. 3A-E and 3G-3L are fragmentary diagrammatic views of a semiconductor device 300, in portion or entirety, at various fabrication stages according to various aspects of the present disclosure. In particular, FIGS. 3A-3D, 3H, 3I, 3L, 3M are cross-sectional views of various stages of a process for reducing roughness of a resist pattern used in fabricating the semiconductor device 300 in accordance with some embodiments. 3A-3D, 3H, 3I, 3L, 3M will be described below with reference to FIGS. 3E, 3F, 3G, 3J and 3K. More specifically, FIGS. 3E and 3J are side perspective views which will be used to further describe a tilt angle of a substrate and the resist lines formed thereon at various stages of the directional ion implantation process, whereas FIG. 3F is a schematic diagram that further illustrates the tilt angle of the substrate with respect to an ion beam and scanning direction that substrate moves in during an ion implantation process. FIGS. 3G and 3K are top perspective views which will be used to further describe rotation of the substrate and the resist lines formed thereon at various stages of the directional ion implantation process.

As a preliminary matter, it is noted that FIGS. 3A-3L follow a certain vector notation, in which the surface 303 of the substrate 302 may be defined by a plane along a first axis (e.g., x-axis) and a second axis (e.g., y-axis). The lines 310, 320, 330 have a length dimension that extends substantially along a direction of the first axis (e.g., x-axis) and a width dimension that extends substantially along a direction of the second axis (e.g., y-axis). A third axis (e.g., z-axis) is perpendicular (i.e., normal to) the first axis (e.g., x-axis) and the second axis (e.g., y-axis).

Semiconductor device 300 may be a portion of an integrated circuit (IC) chip, a system on chip (SoC), or portion thereof, that includes various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. FIGS. 3A-3L have been simplified for the sake of clarity to better understand the inventive concepts of the present disclosure. Additional features can be added in semiconductor device 300, and some of the features described below can be replaced, modified, or eliminated in other embodiments of semiconductor device 300.

As shown in FIG. 3A, a substrate 302 is provided having one or more underlying layers 304 formed thereon, and a resist layer 306 formed over the one or more underlying layers 304. In this simplified example, the intermediate, material layers that are located between the substrate and the resist layers are illustrated as a single underlying layer for purposes of clarity, it should be appreciated that the underlying layers 304 normally include multiple different layers of material. Without limitation, some non-limiting examples of material layers that may be formed between the resist layer 306 and the substrate 302 can include, for example, one or more etch layers, hard mask layers, dielectric layers, anti-reflection coating (ARC) layers, etc. As such, while the resist layer 306 is illustrated as being formed overlying the underlying layer 304, it should be appreciated that, while not illustrated, the underlying layer may include multiple, different layers (not shown) that are located between the resist layer 306 and the substrate 302. For sake of simplicity, only one layer 304 that is to be patterned has been illustrated in FIG. 3A.

The substrate 302 of the semiconductor device 300 may be a wafer, which includes various material layers (for example, dielectric material layers, semiconductor material layers, and/or conductive material layers) and/or IC features (for example, doped regions/features, gate features, and/or interconnect features) depending on IC fabrication stage. The wafer may include various material layers and/or IC features formed on and/or in a silicon substrate. Alternatively, or additionally, the substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. Alternatively, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In one embodiment, the resist layer 306 may be formed, for example, by a spin coating process followed by a soft baking process. The resist layer 306 can be a positive resist or a negative resist. A positive resist is normally insoluble in a resist developer, but is made soluble by exposure to a radiation such as a deep ultraviolet (DUV) ray, an extreme ultraviolet (EUV) ray, an electron beam (e-beam), an x-ray, or other suitable radiation. One exemplary positive resist material is chemically amplified resist (CAR) that contains backbone polymer protected by acid labile groups (ALGs). A negative resist has the opposite behavior—normally soluble in a resist developer, but is made insoluble by exposure to a radiation, such as a DUV ray, an EUV ray, an e-beam, an x-ray, or other suitable radiation. One exemplary negative resist is a polymer which forms intra-molecular and/or intermolecular cross links when irradiated, such as a polymerization of Ethyl($\alpha$-hydroxy)acrylate (EHMA) and methacryl acid (MAA).

As shown in FIG. 3B, the resist layer 306 can be patterned. For example, the resist layer 306 can be exposed to extreme ultraviolet (EUV) light, or another source of actinic radiation, carrying pattern information, and then developed to form a developed resist pattern that includes lines 310, 320. In an embodiment, the patterning process transfers a pattern from a mask (or a photo-mask or a reticle) to the resist layer 306. Alternatively, the patterning process may use a maskless patterning technique such as electron beam direct writing (EBDW). In an embodiment, patterning the resist layer 306 includes exposing the resist layer 306 to a radiation, post-exposure baking, developing the resist layer 306 in a resist developer, and hard baking thereby removing exposed portion (or unexposed in the case of negative resist) of the resist layer 306 and leaving unexposed portions thereof on an ARC layer (not illustrated) as the resist pattern. The radiation may be a DUV ray, an EUV ray, an e-beam, an x-ray, an ion beam, or other suitable radiation. In embodiments where a mask is used to pattern the resist layer 306, the mask can be of different types, such as a transmissive mask or a reflective mask, and can be formed in various technologies, such as binary mask or phase shift mask (PSM). In one example, a binary mask includes a transparent substrate (e.g., fused quartz), and an opaque material (e.g., chromium) coated in the opaque regions of the mask. In another example, a PSM includes various features configured to have proper phase difference to enhance the resolution and imaging quality. In the present example, the resist layer 306 is patterned to form a line pattern that includes two lines 310, 320 for simplification and ease of understanding. However, it should be appreciated that this does not necessarily limit the embodiment to any number of line patterns, any arrangement of line pattern, and/or other types of patterns.

Although FIG. 3B only illustrates two lines 310, 320 for sake of simplicity, it should be appreciated that the developed resist pattern can include any number of substantially parallel lines as well as other features that are not shown in FIG. 3B for sake of clarity. Each line 310, 320 of the developed resist pattern includes sidewalls 312, 314, 322, 324, and while not illustrated in FIG. 3B, each of the sidewalls 312, 314, 322, 324 may exhibit surface roughness as described above with references to FIGS. 1A and 1B. For example, line 310 includes sidewalls 312, 314 that are illustrated as straight lines in FIG. 3B, but it should be appreciated that in reality the sidewalls may exhibit surface roughness, such as line edge roughness (LER) and/or line width roughness (LWR), as described above. Although not illustrated in FIG. 3B, after performing the patterning process, an after development inspection (ADI) process can be performed to check critical dimensions and determine line roughness of the resulting lines 310, 320. As also explained, this surface roughness is undesirable as it can be transferred to the underlying layer 304, lower layers (not illustrated) and eventually to the substrate 302.

The present disclosure addresses the above problems by performing multiple iterations of a directional ion implantation process that synergistically work together to reduce roughness of the patterned resist lines 310, 320 prior to using them to pattern the underlying layer 304. This directional ion implantation process can reduce roughness, such as LER and/or LWR, of the patterned resist lines 310, 320. The reduced roughness of the resulting lines 310, 320 (after patterning in FIG. 3B) can be confirmed by comparing the line roughness before and after performing a directional ion implantation process that will be described below with reference to FIGS. 3D-3K. This reduction in roughness of the lines 310, 320 can be exhibited as reduced LER, reduced LWR, and/or reduced critical dimension of the lines 310, 320 that make up the resist pattern.

As shown in FIG. 3C, in some embodiments, an optional oxide capping layer 340 may be conformally deposited over the developed resist pattern including lines 310, 320. For example, the oxide capping layer 340 may be deposited by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method. In some embodiments, the oxide capping layer 340 can have a thickness between 10 and 100 angstroms. The oxide capping layer 340 can cover the developed resist pattern to add additional mechanical strength to the resist pattern and help compensate for a low height of the resist pattern that may result after the resist layer 306 is patterned in FIG. 3B. This can help compensate for low height and/or low aspect ratio of the lines 310, 320 that make up the resist pattern. This can also be beneficial when the lines 310, 320 that make up the resist pattern are thinner and have smaller critical dimensions since it can help prevent the lines from being eroded during subsequent ion implantation steps that will now be described. The oxide capping layer 340 will inherit the roughness from the sidewall surfaces 312, 314, 322, 324 of the lines 310, 320, and therefore, even when implemented, the roughness of the resist pattern having the capping layer will still need to be reduced.

As shown in FIGS. 3D-3K, a directional ion implantation process is performed on the developed resist pattern. As noted above, in some embodiments, the optional oxide capping layer 340 may be conformally deposited over the developed resist pattern including lines 310, 320, whereas in other embodiments, the optional oxide capping layer 340 is not deposited. Although FIG. 3D illustrates the direction of the implant as being in −z direction, it should be appreciated that this only due to two-dimensional constraints in this particular cross-sectional view. The ion implant actually takes place at a tilt angle relative to the z-axis and in the direction of the −x axis, which is into the page in FIG. 3D. As shown in FIGS. 3D-3G, the lines 310, 320 have a length dimension that extends substantially along a direction of the first axis (e.g., x-axis). Stated differently, in FIG. 3D, the lines 310, 320 have a length dimension that extends into and out of the page. The lines 310, 320 also have a width dimension that extends substantially along a direction of the second axis (e.g., y-axis). The tilt angle is the angle between the third axis (e.g., z-axis) and the incoming ion beam. In some embodiments, the tilt angle is between 40 and 80 degrees.

The concept of the tilt angle is illustrated more clearly in FIGS. 3E and 3F. FIG. 3E is a side perspective view of resist lines 310, 320 that are illustrated in FIG. 3D along with one additional line 330 that is not illustrated in FIGS. 3A-3D. FIG. 3E illustrates one example of a tilt angle 335 at which ions are implanted (as indicated by arrows which are representative of ion beams 360) with respect the resist lines 310, 320, 330 in accordance with some embodiments.

FIG. 3G is a top perspective view of resist lines 310, 320, 330 that are illustrated in FIG. 3E. FIG. 3G illustrates an implant direction (as indicated by the arrows shown in FIG. 3G) at which ions are implanted with respect the resist lines in accordance with some embodiments. As shown in FIG. 3G, the ions are implanted in the direction of the −x axis, which is into the page in FIG. 3D. In the top view illustrated in FIG. 3G, the tilt angle is not visible because the z-axis is into and out of the page.

FIG. 3F is a schematic diagram that further illustrates the tilt angle 335 of the surface 303 of the substrate 302 with respect to an ion beam 360 and scanning direction 309 that a platen (not illustrated) moves in during an ion implantation process. To explain further, the semiconductor device (not shown in FIG. 3F) is held on a platen (not illustrated) that is tilted at the tilt angle 335 with respect to the ion beam 360. During an ion implantation process, an ion implanter can vaporize, accelerate, and direct a beam 360 of ions toward (e.g., back and forth across) the platen as it moves up and down in the scanning direction 309. The ion beam 360 can be directed in this manner until all areas along the surface of the semiconductor device 300, including the lines 310, 320 of the resist pattern, have received a certain dosage of ions.

The ion beam can be generated by an ion implanter with a gas as the ion source. The gas that is used as the ion source can vary depending on the embodiment. In some non-limiting embodiments, the ion species that is implanted can be ions, such as, carbon, silicon, argon, germanium, xenon, or a combination thereof. In some non-limiting embodiments, the ion beam is provided with ion energy from about 0.5 keV to about 3.0 keV and ion dose from about $1.0 \times 10^{13}$ ions/cm$^2$ to about $4 \times 10^{15}$ ions/cm$^2$. The temperature during the implant can be between about −100° C. and about 150° C.

In accordance with the disclosed embodiments, the platen (not illustrated) that holds the semiconductor device 300 can be adjusted to tilt the semiconductor device 300 at the tilt angle with respect to the incoming ion beam from the ion implanter (e.g., a plasma enhanced ion source). As such, the substrate 302, and hence the lines 310, 320 that are formed over the substrate 302, are tilted at the tilt angle with respect to the direction of an incoming ion beam from the ion implanter. In this regard, the tilt angle refers to the angle between the incoming ion beam and an axis normal to the surface of the substrate 302, which is the z-axis. This allows the beam of ions from the ion implanter (not illustrated) to be directionally implanted along sidewall surfaces 312, 314, 322, 324 of the lines 310, 320 in accordance with the tilt angle that is set during any particular iteration of the directional ion implantation process. Directionally implanting ions along the sidewall surfaces 312, 314, 322, 324 of the lines 310, 320 at the tilt angle can trim roughness from the sidewall surfaces 312, 314, 322, 324 of the lines 310, 320 and thereby reduce the roughness of the lines 310, 320. This reduction in roughness of the lines 310, 320 can be exhibited as a reduced line edge roughness (LER), a reduced line width roughness (LWR), and/or a reduced critical dimension of the lines 310, 320 that make up the resist pattern.

As shown in FIGS. 3G and 3H, the platen (not illustrated) that the substrate 302 sits upon can be rotated about 180 degrees along the axis normal to the surface 303 of the substrate 302 (shown as the z-axis in FIGS. 3G and 3H).

As shown in FIG. 3I, after rotation, another beam of ions is directionally implanted (via the ion implanter) at the tilt angle along the sidewall surfaces 324, 322, 314, 312 of the lines 320, 310 to further trim roughness from the sidewall surfaces 324, 322, 314, 312 of the lines 320, 310 to form a trimmed resist pattern. The concept of the tilt angle is illustrated more clearly in FIG. 3J. FIG. 3J is a side perspective view of resist lines 310, 320 that are illustrated in FIGS. 3H-3I along with one additional line 330 that is not illustrated in FIGS. 3H-3I. FIG. 3J illustrates one example of a tilt angle at which ions are implanted (as illustrated by arrows which are representative of ion beams 360) with respect the resist lines 310, 320, 330 in accordance with some embodiments. FIG. 3K is a top perspective view of resist lines 310, 320, 330 that are illustrated in FIG. 3J that illustrate an implant direction at which ions are implanted with respect the resist lines 310, 320, 330 in accordance with some embodiments. As shown in FIG. 3J, the ions are implanted in the direction of the +x axis (as indicated by the arrows on FIG. 3K), which is into the page in FIG. 3I. In the top view illustrated in FIG. 3K, the tilt angle is not visible because the z-axis is into and out of the page.

After the second directional ion implantation (shown in FIGS. 3I-3K), the sidewall surfaces 324, 322, 314, 312 of the lines 320, 310 will have reduced roughness in comparison to the same sidewall surfaces after the first ion implantation step (shown in FIGS. 3D, 3E and 3G) due to a synergistic effect caused by implanting ions along the same surface at the same tilt angle, but from different directions.

As described above with reference to FIG. 2B, the directional ion implantation process (described with reference to FIGS. 3D-3K) can be repeated over any number of iterations. The tilt angle can be adjusted during each iteration (e.g., so that the tilt angle is different than during previous iterations) to further reduce roughness of the sidewall surfaces 312, 314, 322, 324 of the lines 310, 320 of the trimmed resist pattern during each iteration. In addition, in some embodiments, during each iteration of the directional ion implantation process, parameters of the directional implant steps can be varied in addition to varying the tilt angle (e.g., between about 40 degrees to about 80 degrees). For example, during each iteration of the directional ion implantation process the ion species, ion energy and/or ion dose can be varied along with any other implantation parameters or conditions so that they are different than during previous iterations.

Although not illustrated in FIG. 3K, after performing the directional ion implantation process (described with reference to FIGS. 3D-3K), an after implant inspection (AII) process can be performed to check critical dimensions and determine line roughness of the resulting lines 310, 320. The line roughness of the resulting lines 310, 320 (after the directional ion implantation process) can be compared to the line roughness of the resulting lines 310, 320 (after patterning in FIG. 3B) to confirm a reduction in roughness of the lines 310, 320 that can be exhibited as reduced LER, reduced LWR, and/or reduced critical dimension of the lines 310, 320.

After performing the directional ion implantation process (described with reference to FIGS. 3D-3K) over any number of iterations, as shown in FIG. 3L, an etching process (e.g., halogen-based plasma etching process) may be performed on the sidewall surfaces 324, 322, 314, 312 of the lines 320, 310 of the trimmed resist pattern to further reduce roughness of the sidewall surfaces 324, 322, 314, 312. In some embodiments, the etching process can be a directional etching process, such as horizontal or surface anisotropic or selective etching, in which a trimmed resist pattern is etched substantially in only one direction within a plane parallel to the substrate 302, substantially without etching another direction. After performing the etching process in FIG. 3L, an after etching inspection (AEI) process can be performed to check critical dimensions and determine line roughness of the resulting lines 310, 320. The line roughness of the resulting lines 310, 320 after etching in FIG. 3L will exhibit a further reduced line roughness in comparison to the line roughness after the directional ion implantation process was performed in FIGS. 3D-3K. This reduction in roughness of the lines 310, 320 can be exhibited as a further reduced LER, a further reduced LWR, and/or a further reduced critical dimension of the lines 310, 320 that make up the resist pattern.

As shown in FIG. 3M, the oxide capping layer 340 (if implemented) and the underlying layer 304 may then be patterned by performing one or more etching processes (e.g., using the trimmed resist pattern as an etch mask). This patterning results in lines 370, 380 that are formed from the material of the underlying layer 304. Line 370 will have sidewalls 372, 374 that inherit the pattern of the sidewalls 324, 322 of line 320 of the trimmed resist pattern, and line 380 will have sidewalls 382, 384 that inherit the pattern of the sidewalls 314, 312 of line 310 of the trimmed resist pattern, which as noted above will exhibit reduced roughness. After performing the etching process in FIG. 3M, an after etching inspection (AEI) process can optionally be performed to check critical dimensions and determine line roughness of the resulting lines 370, 380. The line roughness of the resulting lines 370, 380 (after the etching process in FIG. 3M) can be compared to the line roughness of the resulting lines 310, 320 (after patterning in FIG. 3B) to confirm a reduction in roughness of the lines 370, 380 that can be exhibited as reduced LER, reduced LWR, and/or reduced critical dimension of the lines 370, 380.

As such, directional ion implantation processes are disclosed in accordance with the disclosed embodiments that allow roughness of sidewall surfaces of patterned resist lines to be reduced by implanting ions at a tilt angle between the incoming ion beam and an axis normal to a surface of the line the ions are being implanted into. A synergistic improvement in roughness can be achieved when multiple directional ion implantations steps take place at the same tilt angle, but in different directions across same sidewall surfaces of patterned resist lines. Roughness may be further reduced by performing multiple iterations of the directional ion implantation process and changing the tilt angle on each iteration of the directional ion implantation process (e.g., so that the tilt angle is different than during previous iterations). In some embodiments, the tilt angle can be varied within the ranges of between about 40 degrees to about 80 degrees. Roughness may be further reduced by performing multiple iterations of the directional ion implantation process and changing the implant parameters or conditions (e.g., ion energy and/or ion dose) on each iteration of the directional ion implantation process so that they are different on each iteration of the directional ion implantation process.

In accordance with some embodiments, a method of performing a directional ion implantation process on a developed resist pattern is provided to reduce roughness. A resist pattern can be developed above a surface of a substrate. The developed resist pattern comprises a line having sidewall surfaces. The substrate may be tilted at a tilt angle with respect to the direction of an incoming ion beam from an ion implanter. The tilt angle is the angle between the incoming ion beam and an axis normal to the surface. Ions can then be directionally implanted at the tilt angle, via the ion implanter, along the sidewall surfaces of the line to reduce roughness of the sidewall surfaces of the line. After implanting, the substrate can be rotated along the axis normal to the surface, and ions can be directionally implanted at the tilt angle, via the ion implanter, along the sidewall surfaces of the line to further reduce roughness of the sidewall surfaces of the line.

In accordance with some embodiments, the directional ion implantation process can be repeated over a number of iterations, and the tilt angle may be adjusted during each iteration of the directional ion implantation process so that the tilt angle is different than during previous iterations of the directional ion implantation process.

In accordance with some embodiments, during each iteration of the directional ion implantation process, one or more parameters of the ion implantation process may be adjusted so that the one or more parameters are different than during previous iterations of the directional ion implantation process.

In accordance with some embodiments, after implanting, the substrate can be rotated 180 degrees along the axis normal to the surface.

In accordance with some embodiments, a directional etching process can be performed on the sidewall surfaces of the line, after performing a directional ion implantation process, to further reduce roughness of the sidewall surfaces.

In accordance with some embodiments, prior to performing the directional ion implantation, an oxide capping layer can be deposited over the developed resist pattern.

In accordance with some embodiments, the substrate is a material layer formed over a wafer, the resist is formed over the substrate, and the developed resist pattern comprises: a plurality of substantially parallel lines each having sidewall surfaces. The surface can be defined by a plane along a first axis and a second axis, where a third axis is substantially perpendicular to the first axis and the second axis, and where the line has a length dimension that extends substantially along a direction of the first axis and a width dimension that extends substantially along a direction of the second axis. In such embodiments, the tilt angle is the angle between the third axis and the incoming ion beam, and may be between 40 and 80 degrees.

In accordance with some embodiments, a method is provided in which a resist pattern is developed above a surface of a substrate, and a directional ion implantation process is performed on the developed resist pattern. The developed resist pattern can include a plurality of substantially parallel lines each having sidewall surfaces.

In accordance with some embodiments, performing the directional ion implantation process comprises: tilting the substrate at a tilt angle with respect to the direction of an incoming ion beam from an ion implanter, wherein the tilt angle is the angle between the incoming ion beam and an axis normal to the surface; directionally implanting ions at the tilt angle, via the ion implanter, along the sidewall surfaces of the lines to trim roughness from the sidewall surfaces of the lines; after implanting, rotating the substrate along the axis normal to the surface; and directionally implanting ions at the tilt angle, via the ion implanter, along the sidewall surfaces of the lines to further trim roughness from the sidewall surfaces of the lines to form a trimmed resist pattern having sidewall surfaces with reduced roughness in comparison to the sidewalls of the developed resist pattern.

In accordance with some embodiments, the method further comprises repeating the directional ion implantation process over a number of iterations, and during each iteration of the directional ion implantation process, adjusting the tilt angle so that the tilt angle is different than during previous iterations of the directional ion implantation process.

In accordance with some embodiments, the method further comprises repeating the directional ion implantation process over a number of iterations, and during each iteration of the directional ion implantation process, adjusting one or more parameters of the ion implantation process so that the one or more parameters are different than during previous iterations of the directional ion implantation process.

In accordance with some embodiments, the method further comprises performing a directional etching process, after performing the directional ion implantation process, on the sidewall surfaces of the trimmed resist pattern to further reduce roughness of the sidewall surfaces of the trimmed resist pattern.

In accordance with some embodiments, the method further comprises depositing an oxide capping layer over the developed resist pattern prior to performing the directional ion implantation.

In accordance with some embodiments, the trimmed resist pattern overlies an underlying layer, and the method further comprises patterning the underlying layer by performing an etching process using the trimmed resist pattern as a mask.

In accordance with some embodiments, the surface is defined by a plane along a first axis and a second axis, and a third axis is substantially perpendicular to the first axis and the second axis. The lines can each have a length dimension that extends substantially along a direction of the first axis and a width dimension that extends substantially along a direction of the second axis. The tilt angle is the angle between the third axis and the incoming ion beam.

In accordance with some embodiments, the tilt angle is between 40 and 80 degrees.

In accordance with some embodiments, the substrate can be rotated 180 degrees along the axis normal to the surface after implanting.

In accordance with some embodiments, a method of reducing roughness of sidewall surfaces of a patterned resist line is provided. The patterned resist line is tilted at a tilt angle with respect to the direction of an incoming ion beam. The tilt angle is the angle between the incoming ion beam and an axis normal to a surface of the patterned resist line. Ions can then be directionally implanted at the tilt angle along the sidewall surfaces of the patterned resist line to reduce roughness of the sidewall surfaces of the patterned resist line. After implanting, the patterned resist line can be rotated along the axis normal to the surface of patterned resist line, and ions can be directionally implanted at the tilt angle along the sidewall surfaces of the patterned resist line to further reduce roughness of the sidewall surfaces of the patterned resist line.

In accordance with some embodiments, the directional ion implantation process can be repeated over a number of iterations, and during each iteration of the directional ion implantation process, the tilt angle can be adjusted so that the tilt angle is different than during previous iterations of the directional ion implantation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate having a material layer formed over a surface of the substrate and having a developed resist pattern comprising a line with sidewall surfaces formed over the material layer;
conformally depositing an oxide capping layer over the developed resist pattern;
after conformally depositing the oxide capping layer, tilting the substrate at a tilt angle with respect to the direction of an incoming ion beam from an ion implanter, wherein the tilt angle is an angle between the incoming ion beam and an axis normal to the surface;
directionally implanting ions at the tilt angle, via the ion implanter, along the sidewall surfaces of the line to reduce roughness of the sidewall surfaces of the line;
after implanting, rotating the substrate along the axis normal to the surface; and
directionally implanting ions at the tilt angle, via the ion implanter, along the sidewall surfaces of the line to further reduce roughness of the sidewall surfaces of the line to form a trimmed resist pattern.

2. The method of claim 1, further comprising:
repeating the directional ion implantation process over a number of iterations; and
during each iteration of the directional ion implantation process: adjusting the tilt angle so that the tilt angle is different than during previous iterations of the directional ion implantation process.

3. The method of claim 1, further comprising:
repeating the directional ion implantation process over a number of iterations; and
during each iteration of the directional ion implantation process adjusting one or more of ion species that is implanted, ion energy, or ion dose so that the adjusted one or more ion species that is implanted, ion energy, or ion dose are different than during previous iterations of the directional ion implantation process.

4. The method of claim 1, further comprising:
after performing a directional ion implantation process: performing a directional etching process on the sidewall surfaces of the line to further reduce roughness of the sidewall surfaces.

5. The method of claim 1, further comprising:
patterning the material layer by performing an etching process using the trimmed resist pattern as a mask.

6. The method of claim 1, wherein the developed resist pattern comprises: a plurality of substantially parallel lines each having sidewall surfaces.

7. The method of claim 1, wherein the surface is defined by a plane along a first axis and a second axis, wherein a third axis is substantially perpendicular to the first axis and the second axis, wherein the line has a length dimension that extends substantially along a direction of the first axis and a width dimension that extends substantially along a direction of the second axis, and wherein the tilt angle is an angle between the third axis and the incoming ion beam.

8. The method of claim 1, wherein the tilt angle is between 40 and 80 degrees.

9. The method of claim 1, wherein rotating comprises:
after implanting, rotating the substrate 180 degrees along the axis normal to the surface.

10. A method, comprising:
developing a resist pattern above a surface of a substrate, wherein the developed resist pattern comprises: a plurality of substantially parallel lines each having sidewall surfaces;
conformally depositing an oxide capping layer over the developed resist pattern;
after conformally depositing the oxide capping layer, performing a directional ion implantation process on the developed resist pattern, wherein performing comprises:
tilting the substrate at a tilt angle with respect to the direction of an incoming ion beam from an ion implanter, wherein the tilt angle is the angle between the incoming ion beam and an axis normal to the surface;
directionally implanting ions at the tilt angle, via the ion implanter, along the sidewall surfaces of the lines to trim roughness from the sidewall surfaces of the lines;
after implanting, rotating the substrate along the axis normal to the surface; and
directionally implanting ions at the tilt angle, via the ion implanter, along the sidewall surfaces of the lines to further trim roughness from the sidewall surfaces of the lines to form a trimmed resist pattern having sidewall surfaces with reduced roughness in comparison to the sidewalls of the developed resist pattern.

11. The method of claim 10, further comprising:
repeating the directional ion implantation process over a number of iterations; and
during each iteration of the directional ion implantation process: adjusting the tilt angle so that the tilt angle is different than during previous iterations of the directional ion implantation process.

12. The method of claim 10, further comprising:
repeating the directional ion implantation process over a number of iterations; and
during each iteration of the directional ion implantation process adjusting one or more of ion species that is implanted, ion energy, or ion dose so that the adjusted one or more ion species that is implanted, ion energy, or ion dose are different than during previous iterations of the directional ion implantation process.

13. The method of claim 10, further comprising:
after performing a directional ion implantation process: performing a directional etching process on the sidewall surfaces of the trimmed resist pattern to further reduce roughness of the sidewall surfaces of the trimmed resist pattern.

14. The method of claim 10, wherein the trimmed resist pattern overlies an underlying layer, and further comprising:
patterning the underlying layer by performing an etching process using the trimmed resist pattern as a mask.

15. The method of claim 10, wherein the surface is defined by a plane along a first axis and a second axis, wherein a third axis is substantially perpendicular to the first axis and the second axis, wherein the lines each have a length dimension that extends substantially along a direction of the first axis and a width dimension that extends substantially along a direction of the second axis, and wherein the tilt angle is the angle between the third axis and the incoming ion beam.

16. The method of claim 10, wherein the tilt angle is between 40 and 80 degrees.

17. The method of claim 10, wherein rotating comprises:
after implanting, rotating the substrate 180 degrees along the axis normal to the surface.

18. A method of reducing roughness of sidewall surfaces of a patterned resist line of a developed resist pattern, the method comprising:
conformally depositing an oxide capping layer over the developed resist pattern;
after conformally depositing the oxide capping layer, tilting the patterned resist line at a tilt angle with respect to the direction of an incoming ion beam, wherein the tilt angle is the angle between the incoming ion beam and an axis normal to a surface of the patterned resist line;
directionally implanting ions at the tilt angle along the sidewall surfaces of the patterned resist line to reduce roughness of the sidewall surfaces of the patterned resist line;
after implanting, rotating the patterned resist line along the axis normal to the surface of patterned resist line;
directionally implanting ions at the tilt angle along the sidewall surfaces of the patterned resist line to further reduce roughness of the sidewall surfaces of the patterned resist line; and
etching the sidewall surfaces of the patterned resist line to further reduce roughness of the sidewall surfaces of the patterned resist line.

19. The method of claim 18, further comprising:
repeating the directional ion implantation process over a number of iterations; and
during each iteration of the directional ion implantation process: adjusting the tilt angle so that the tilt angle is different than during previous iterations of the directional ion implantation process.

20. The method of claim 18, further comprising:
repeating the directional ion implantation process over a number of iterations; and
during each iteration of the directional ion implantation process adjusting one or more of ion species that is implanted, ion energy, or ion dose so that the adjusted one or more ion species that is implanted, ion energy, or ion dose are different than during previous iterations of the directional ion implantation process.

* * * * *